(12) United States Patent
Higashiwaki

(10) Patent No.: US 7,547,911 B2
(45) Date of Patent: Jun. 16, 2009

(54) GAN-BASED FIELD EFFECT TRANSISTOR AND PRODUCTION METHOD THEREFOR

(75) Inventor: Masataka Higashiwaki, Tokyo (JP)

(73) Assignee: National Institute of Information and Communications Technology, Incorporated Administrative Agency, Koganei-Shi, Tokyo ( * ) Notice: Subject to any disclaimer, the term of this patent is extended or adjusted under 35 U.S.C. 154(b) by 128 days.

(21) Appl. No.: 11/661,344

(22) PCT Filed: Aug. 26, 2005

(86) PCT No.: PCT/JP2005/016065

§ 371 (c)(1),
(2), (4) Date: Feb. 27, 2007

(87) PCT Pub. No.: WO2006/022453

PCT Pub. Date: Feb. 3, 2006

(65) Prior Publication Data

US 2007/0295990 A1  Dec. 27, 2007

(30) Foreign Application Priority Data

Aug. 27, 2004  (JP) .............................. 2004-249297

(51) Int. Cl.
*H01L 31/00* (2006.01)

(52) U.S. Cl. ............................ 257/20; 267/24; 267/192; 267/194; 267/E21.403

(58) Field of Classification Search ................... 257/20, 257/24, 192, 194, 195, E21.403
See application file for complete search history.

(56) References Cited

U.S. PATENT DOCUMENTS

2007/0254418 A1 * 11/2007 Sheppard et al. ............ 438/172

FOREIGN PATENT DOCUMENTS

JP         2003-59948         2/2003

OTHER PUBLICATIONS

International Search Report for PCT/JP2006/016065 mailed Dec. 6, 2005 (1 page).

* cited by examiner

*Primary Examiner*—Evan Pert
*Assistant Examiner*—Scott R Wilson
(74) *Attorney, Agent, or Firm*—Osha • Liang LLP

(57) ABSTRACT

A GaN-based heterostructure field effect transistor capable of accomplishing higher output, higher breakdown voltage, higher speed, higher frequency, and the like. A heterostructure field effect transistor including a channel layer (4) of GaN and a barrier layer (6) of AlGaN, wherein the surface of a transistor element has an insulating film (10).

6 Claims, 8 Drawing Sheets

US 7,547,911 B2

GAN-BASED FIELD EFFECT TRANSISTOR AND PRODUCTION METHOD THEREFOR

TECHNICAL FIELD

The present invention relates to a field-effect transistor having a heterostructure with a remarkable high output, high breakdown voltage, high speed, and high frequency response.

BACKGROUND ART

A heterostructure field-effect transistor (FET) is a transistor having an interface (heterointerface) consisting of two materials with different properties such as lattice constants, and two-dimensional electron gas formed at the heterointerface is made a channel. As a heterostructure FET, GaN-based FET is known. As the GaN-based FET, AlGaN/GaN heterostructure FET is known (see for example, following patent document 1 (Japanese Patent application laid-open No. 2003-258005), patent document 2 (Japanese patent application laid-open No. 2003-243424)). This AlGaN/GaN heterostructure FET can obtain a high two-dimensional electron density due to a polarization effect. FIG. 8 shows a schematic diagram of a general heterostructure FET. As shown in FIG. 8, the heterostructure FET includes a substrate 2, a buffer layer 3 provided on the substrate, a channel layer 4 provided on the buffer layer, a spacer layer 5 provided on the channel layer, and a barrier layer 6 provided on the spacer layer. Generally, a source electrode 7, a gate electrode 8, and a drain electrode 9 are provided.

In order to increase gate effectiveness of the transistor and to improve transconductance ($g_m$), it is desirable to reduce the thickness of the AlGaN barrier layer. However, when the thickness of the AlGaN layer is reduced, the effect of the electric field due to the AlGaN surface states at the AlGaN/GaN heterointerface is increased. This brings problems that the polarization effect at the heterointerface is reduced, the two-dimensional electron density is reduced, and the resistance of the channel is increased.

Therefore, in order to improve the performance of the AlGaN/GaN heterostructure transistor, and to respond to increase in speed and frequency, it is effective to reduce the thickness of the AlGaN layer, while simultaneously reducing the effect of the electric field due to the AlGaN surface states, in order to increase the polarization effect at the AlGaN/GaN heterointerface and increase the two-dimensional electron density. From this view point, a recessed-gate FET is known, in which a cap layer and the barrier layer just under the gate electrode portion are dug down by etching to make the gate electrode closer to the channel layer (for example, the following non-patent document 1 (Yoshiaki SANO, Katsuaki KAIFU, Juro MITA and Takashi EGAWA, "Recessed gate nitride field effect transistor with high transconductance characteristics", Oyo Buturi, Vol. 73, No. 3 Pages 358-362, 2004), and patent document 3 (Japanese patent application laid-open No. 2004-186679). As shown in FIG. 1 of the non-patent document 1 and FIG. 3 of the patent document 3, in the recessed-gate FET, a portion under the gate electrode in the barrier layer and the cap layer is deeply etched.

By using such a recessed-gate FET, it is said that the gate effectiveness of the transistor can be increased almost without reducing outputs of the electric current and electric power, and that this recessed gate structure is formed by reactive ion etching and the like using $BCl_3$ gas and the like. However, since a gas ion etching is required in order to produce a recessed-gate FET, the process becomes complicated. Also, since gas activated by plasma is used for etching, the etched semiconductor surface is damaged. Also, since the reactive ion etching is not very accurate, it is difficult in reality to obtain appropriate recessed-gate FETs with a good reproducibility.

DISCLOSURE OF THE INVENTION

Figure 1:
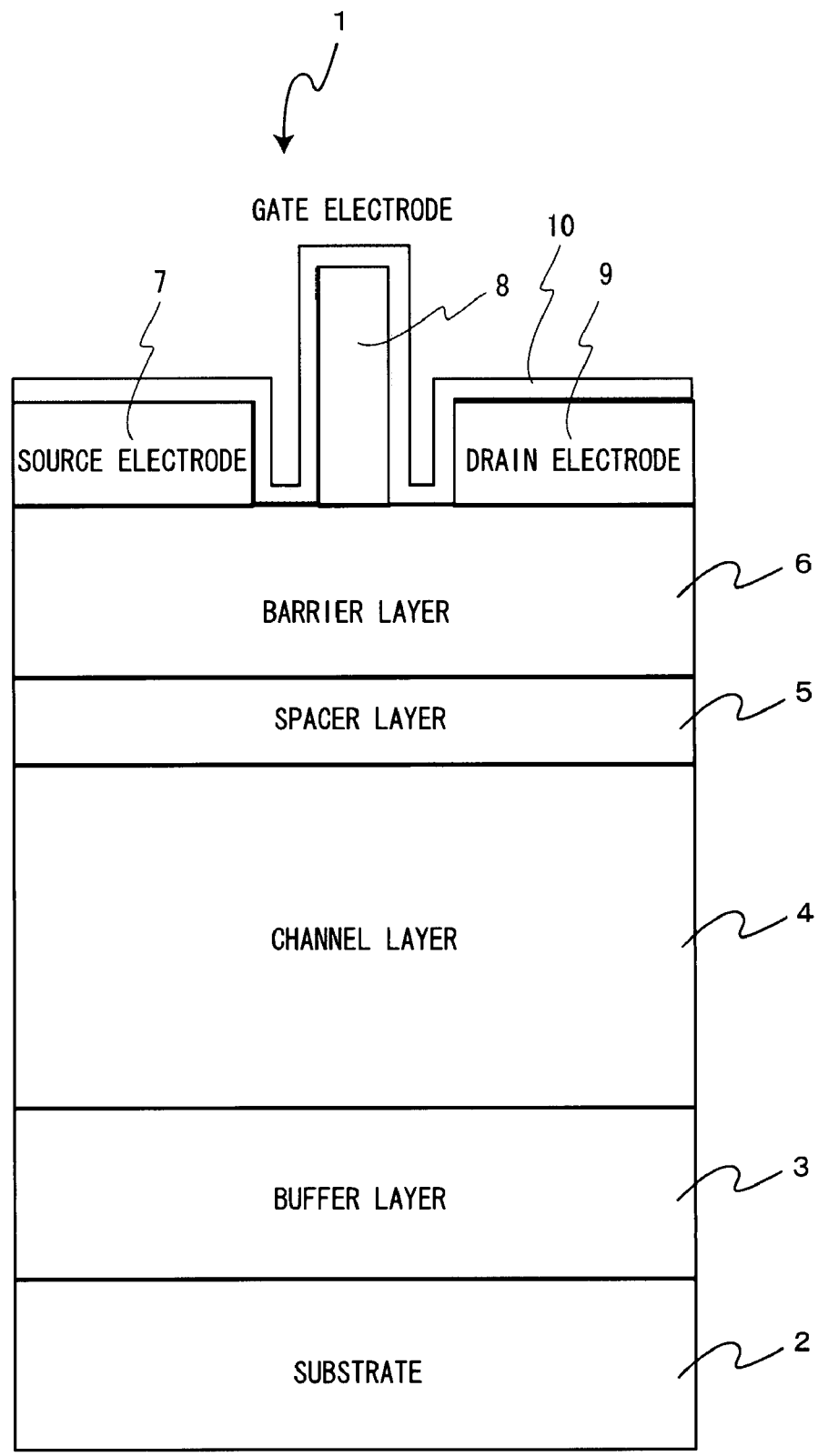
FIG. 1 is a schematic diagram showing a heterostructure FET according to the first embodiment of the present invention.

It is an object of the present invention to provide a GaN-based heterostructure transistor capable of achieving a high output, high breakdown voltage, high speed, and high frequency.

It is another object of the present invention to provide a heterostructure FET using a barrier layer having an even film thickness without having a recessed-gate structure.

It is another object of the present invention to provide a heterostructure FET whose a two-dimensional electron gas density is high, which has an excellent transconductance and is capable of obtaining a large output.

It is another object of the present invention to provide a heterostructure FET capable of realizing a high speed and high frequency by a gate electrode miniaturization.

The present invention is basically related to a heterostructure FET and a production method therefore, wherein a high two-dimensional electron density and a high transconductance can be achieved by deposition of an insulating film on a surface of an elemental device in a GaN-based heterostructure FET.

At least one of the above-mentioned objects can be achieved by a field-effect transistor according to the first aspect of the present invention which is a GaN-based field-effect transistor having a heterostructure including a channel layer and a barrier layer; and an insulating film on a transistor device surface. Having an insulating film on the surface of the elemental device, the surface potential of the barrier layer can be reduced, and the electric field effect due to the surface states for the polarization effect at the heterointerface can be reduced. Consequently, the two-dimensional electron density is increased, so that a high output can be obtained. It is to be noted that a "GaN-based FET" means an FET whose composition of the channel layer is GaN (or InGaN), such as an AlGaN/GaN heterostructure FET.

A preferable aspect of a field-effect transistor is the field-effect transistor described in claim 1, wherein the insulating film comprises any one of SiN, $SiO_2$, SiON, $Al_2O_3$, and AlN.

A preferable aspect of a field-effect transistor is the field-effect transistor described in claim 1, wherein the insulating film comprises SiN formed by a hot wire CVD method.

A preferable aspect of a field-effect transistor is the field-effect transistor described in claim 1, wherein a change in electron mobility in a range within 20 mm from a specific position of the field-effect transistor is equal to or less than 10%.

A preferable aspect of a field-effect transistor is the field-effect transistor described in claim 1, wherein a change in two-dimensional electron density in a range within 20 mm from a specific position of the field-effect transistor is equal to or less than 10%.

A preferable aspect of a field-effect transistor is the field-effect transistor described in any one of the above, wherein a thickness of the insulating film is 1 nm-1 µm.

A preferable aspect of a field-effect transistor is the field-effect transistor described in any one of the above, wherein the insulating film comprises SiN formed by a hot wire CVD method, and a thickness of the insulating film is 1 nm-100 nm.

A preferable aspect of a field-effect transistor is the field-effect transistor described in any one of the above, wherein the channel layer comprises GaN and the barrier layer comprises AlGaN.

A preferable aspect of a field-effect transistor is the field-effect transistor described in any one of the above, wherein a thickness of the barrier layer is 1-30 nm.

A preferable aspect of a field-effect transistor is the field-effect transistor described in any one of the above, wherein a thickness of the barrier layer is 3-20 nm.

A preferable aspect of a field-effect transistor is the field-effect transistor described in any one of the above, wherein a thickness of the barrier layer is 5-15 nm.

A preferable aspect of a field-effect transistor is the field-effect transistor described in any one of the above, wherein a thickness of the channel layer is 100 nm-10 µm.

A preferable aspect of a field-effect transistor is a field-effect transistor, wherein a buffer layer, a channel layer composed of GaN, and a barrier layer composed of AlGaN are formed on a substrate in this order; a thickness of the barrier layer is 1-30 nm; and an insulating film is provided on a transistor device surface.

A preferable aspect of a field-effect transistor is the field-effect transistor described in any one of the above, wherein the insulating film comprises any one of SiN, $SiO_2$, SiON, $Al_2O_3$, and AlN.

A preferable aspect of a field-effect transistor is the field-effect transistor described in any one of the above, wherein the insulating film comprises SiN formed by a hot wire CVD method.

A preferable aspect of a field-effect transistor is the field-effect transistor described in any one of the above, wherein a change in electron mobility in a range within 20 mm from a specific position of the field-effect transistor is equal to or less than 10%.

A preferable aspect of a field-effect transistor is the field-effect transistor described in any one of the above, wherein a change in a two-dimensional electron density in a range within 20 mm from a specific position of the field-effect transistor is equal to or less than 10%.

A preferable aspect of a field-effect transistor is the field-effect transistor described in any one of the above, wherein a thickness of the insulating film is 1 nm-1 µm.

A preferable aspect of a field-effect transistor is the field-effect transistor described in any one of the above, wherein the insulating film comprises SiN formed by a hot wire CVD method, and a thickness of the insulating film is 1 nm-100 nm.

A preferable aspect of a field-effect transistor is the field-effect transistor described in any one of the above, wherein a spacer layer is provided between the channel layer and the barrier layer.

The second aspect of the present invention relates to a method of producing a field-effect transistor having a heterostructure including: a step of forming a buffer layer, a channel layer of GaN, and a barrier layer of AlGaN in this order on a substrate; a step of forming a source electrode, a gate electrode, and a drain electrode; and a step of forming an insulating film on a surface of the barrier layer.

A preferable aspect of a method of producing a field-effect transistor is the method of producing a field-effect transistor having a heterostructure as described in claim 21, wherein the step of forming the insulating film on the surface of the barrier layer uses any one of SiN, $SiO_2$, SiON, $Al_2O_3$, and AlN as a raw material, and forms the insulating film by a hot wire CVD method.

A preferable aspect of a method of producing a field-effect transistor is the method of producing a field-effect transistor having a heterostructure as described in claim 21, wherein a thickness of the insulating film is 1 nm-1 µm.

A preferable aspect of a method of producing a field-effect transistor is the method of producing a field-effect transistor having a heterostructure as described in claim 21, wherein a thickness of the barrier layer of AlGaN is 3 nm-20 nm.

As verified by examples that will be described later, the GaN-based heterostructure FET of the present invention can reduce the surface potential of the barrier layer by deposition of an insulating film on a surface of the AlGaN and the like barrier layer. Accordingly, the electric field effect due to the surface states can be reduced, so that the two-dimensional electron density is consequently increased, and a high output can be obtained. Specifically, for the GaN-based heterostructure FET of the present invention, one with a configuration having an SiN insulating film formed by a hot wire CVD method is preferable, and one in which a spacer layer of a specific composition is used in combination is more preferable. As shown in the examples, the heterostructure FET of the present invention achieves a more remarkable effect when a thickness of the barrier layer is made 12 nm or less (especially 10 nm or less), and a large transconductance can be obtained without reducing the maximum output current and power.

Namely, according to the present invention, a heterostructure transistor capable of achieving a high output, high breakdown voltage, high speed, and high frequency can be provided.

According to the present invention, a heterostructure FET using a barrier layer having an even film thickness without having a recessed-gate structure can be provided.

According to the present invention, a heterostructure FET whose a two-dimensional electron gas density is high, which has an excellent transconductance characteristic, and which is capable of obtaining a large output can be provided.

According to the present invention, a heterostructure FET capable of realizing a high speed and a high frequency by gate electrode miniaturization can be provided.

BEST MODE FOR CARRYING OUT THE INVENTION (1. Heterostructure FET)

Hereinafter, embodiments of the present invention will be described according to the drawings. As described above, the heterostructure FET of the present invention is basically a GaN-based heterostructure FET having a heterostructure including a channel layer and a barrier layer, and which has an insulating film on a transistor surface, wherein the number of surface states can be reduced, a polarization effect in heterostructure is increased, a two-dimensional electron density is increased, and a high output can be obtained by deposition of an insulating film on a surface of an AlGaN barrier layer. Also, the heterostructure FET of the present invention can obtain a higher effect when the thickness of the barrier layer is thinner compared to a conventional barrier layer, and an excellent transconductance can be obtained without reducing the output current and power.

(1.1. Outline of Heterostructure FET)

FIG. 1 is a schematic diagram showing a heterostructure FET according to the first embodiment of the present invention. As shown in FIG. 1, the heterostructure FET according to the present invention includes a substrate 2, a buffer layer 3 provided on the substrate, a channel layer 4 provided on the buffer layer, a spacer layer 5 provided on the channel layer, and a barrier layer 6 provided on the spacer layer. As shown in FIG. 1, a source electrode 7, a gate electrode 8, and a drain electrode 9 are provided in this embodiment. Also, an insulating film 10 is deposited on a surface of the element device, so that the surface of the element device is stabilized. It is to be noted that the heterointerface is formed between the channel layer and the spacer layer. It is to be noted that the heterostructure FET according to the present invention may be an FET with an MIS (Metal-Insulator-Semiconductor)-gate configuration as will be later described in FIG. 7.

(1.2. Substrate)

As a substrate, a publicly known substrate used for a GaN-based heterostructure FET can be adopted. As a material of a substrate, sapphire, SiC, GaN, or AlN can be mentioned, and the sapphire is preferable thereamong.

(1.3. Buffer Layer)

A buffer layer is also called a nucleation layer. A difference of lattice constants between the sapphire substrate and GaN is as large as approximately 16.3%. Accordingly, if the GaN layer (channel layer) is directly grown on the sapphire substrate, defects and dislocations of an extremely high density are generated in the GaN layer, so that a high-quality crystal cannot be obtained. In order to avoid such a situation, a buffer layer is provided between the substrate and the GaN layer. As a composition of the buffer layer, a publicly known composition of the buffer layer used for a GaN-based heterostructure FET in addition to an AlN can be mentioned. While the film thickness of the buffer is not specifically limited, 10 nm-1000 nm can be mentioned, 100 nm-500 nm is preferable, 200 nm-400 nm is more preferable, and 250 nm-350 nm is further more preferable.

(1.4. Channel Layer)

A channel layer is a layer that forms the heterointerface. As the composition of the channel layer, GaN or InGaN can be mentioned, and GaN is preferable. As the film thickness of the channel layer, 100 nm-10 μm can be mentioned, while 500 nm-3 μm is preferable, and 1 μm-2 μm is more preferable. A transistor having gallium nitride (GaN) as the channel layer can obtain a high output since the band gap of the GaN is as large as approximately 3.4 eV. Also, this transistor can perform a high-voltage operation. Supposing the composition of the InGaN to be $In_XGa_{1-X}N$, 0.0001-0.2 can be mentioned as X, which is preferably 0.001-0.05.

(1.5. Spacer Layer)

A spacer layer is an arbitrary thin layer provided between the channel layer and the barrier layer. The heterointerface is an interface between the channel layer and the spacer layer. The heterostructure FET according to the first embodiment of the present invention described in FIG. 1 has a spacer layer. However, a spacer layer is not indispensable in the heterostructure FET of the present invention. In this case, an interface between the channel layer and the barrier layer assumes the heterointerface. As the composition of the spacer layer, AlN, AlGaN, InAlGaN, or GaN can be mentioned, wherein AlN, or AlGaN is preferable, and AlN is more preferable. As the film thickness of the spacer layer, 0.1 nm-5 nm can be mentioned, while 0.5 nm-3 nm is preferable, and 1 nm-2 nm is more preferable. It is to be noted that assuming that the AlGaN composition is $Al_XGa_{1-X}N$, X is 0.0001-0.9999, and a preferable X is 0.1-0.6. Assuming that the InAlGaN composition is $In_XAl_YGa_{1-X-Y}N$, 0.0001-0.2 can be mentioned as X, and a preferable X is 0.001-0.05, 0.1-0.9 can be mentioned as Y, while a preferable Y is 0.2-0.6. It is to be noted that specifically when the insulating film is formed by a hot wire CVD method, Y may be 0.3 or more, 0.4 or more, or 0.45 or more in forming a preferable spacer layer.

(1.6. Barrier Layer)

A barrier layer is a layer having a larger band gap compared to a channel layer. In the heterostructure FET of the present invention, while AlGaN or InAlGaN can be mentioned as the barrier layer, a barrier layer composed of AlGaN (AlGaN barrier layer) is especially preferable. It is to be noted that while the barrier layer may be one having the gate electrode portion dug down as in a recessed-type, a barrier layer having an even film thickness which is not a recessed-type is preferable. While the recessed-type FETs are hard to be processed with a good reproducibility, ones with a fixed thickness of the barrier layer can be processed with a good reproducibility. Also, as will be described later, a higher two-dimensional electron density can be achieved by the insulating layer in the present invention, a complicated form as in the recessed-type is not necessary. Assuming that the AlGaN composition of the AlGaN barrier layer is $Al_XGa_{1-X}N$, 0.0001-0.9999 can be mentioned as X, and a preferable X is 0.1-0.9, while X may also be 0.1-0.5, 0.2-0.4, or 0.3-0.6.

Since the present invention has an insulating layer on the surface of the element device, as will be shown in the embodiments that will be later described, a high two-dimensional electron density can be maintained. Consequently, the barrier layer may be made thin, and a high transconductance can be achieved. Therefore, while the film thickness of the barrier layer is not specifically limited, 1 nm-50 nm can be mentioned, and while 1-30 nm is preferable, 1 nm-20 nm is more preferable, 2 nm-15 nm is further more preferable, and 5-12 nm is especially preferable, selection from 3 nm-20 nm, 5 nm-15 nm, 1 nm-10 nm, 5 nm-10 nm, 10 nm-15 nm, 10 nm-100 nm, 20 nm-100 nm, 25 nm-50 nm, 10 nm-25 nm, 5 nm-50 nm or the like may be appropriately made. It is to be noted that as will be described later, a large effect can be produced by providing the insulating film when the film thickness of the barrier layer is 20 nm or less, and an effect such that a large transconductance can be achieved without decreasing the maximum output current and power can be exerted when the film thickness of the barrier layer is preferably 15 nm or less, and more preferably when the film thickness of the barrier layer is 12 nm or less.

(1.7. Electrode)

As an electrode used for the heterostructure FET of the present invention, a publicly known electrode used for a heterostructure FET can be adopted. As such an electrode, one composed of a source electrode 7, a gate electrode 8, and a drain electrode 9 can be mentioned.

(1.8. Insulating Film)

An insulating film is a film formed on the transistor element surface that stabilizes the surface of the AlGaN barrier layer which is chemically and electrically active. As the insulating film, one composed of any one of or more than one of SiN, $SiO_2$, SiON, $Al_2O_3$, and AlN can be mentioned. The insulating film is preferably composed of any one of these materials. A preferable material among them is SiN. Specifically, the insulating film composed of SiN formed by a hot wire CVD method is preferable. With the insulating film, the two-dimensional electron density of the FET can be increased, and the transconductance can be increased, so that the output of the FET can be increased. Additionally, by covering the AlGaN barrier layer surface with the insulating film, degradation due to oxidization or the like can be prevented, and the operation of the element device can be stably maintained for a long period. Namely, the insulating film also works as a protective film for stabilization of the element surface.

As the average film thickness of the insulating film, while depending on the composition of the insulating film, e.g. 1 nm-1 μm can be mentioned for guaranteeing the function of the insulating film, 10 nm-500 nm is acceptable, 10 nm-300 nm is also acceptable, and 20 nm-40 nm is also acceptable, 20 nm-200 nm is preferable. It is to be noted that in case of a field-effect transistor of a so-called MIS (Metal-Insulator-Semiconductor)-gate configuration as will be later described in FIG. 7, the insulating film is preferably thin, and as an average film thickness of the insulating film, 1 nm-120 nm can be mentioned, while 1 nm-10 nm is preferable, 1.5 nm-6 nm is more preferable, and 1.5 nm-3 nm is further more preferable.

(2. Effects)

Effects of the insulating film deposition in the AlGaN/GaN heterostructure FET according to the present invention will now be described.

Figure 2:
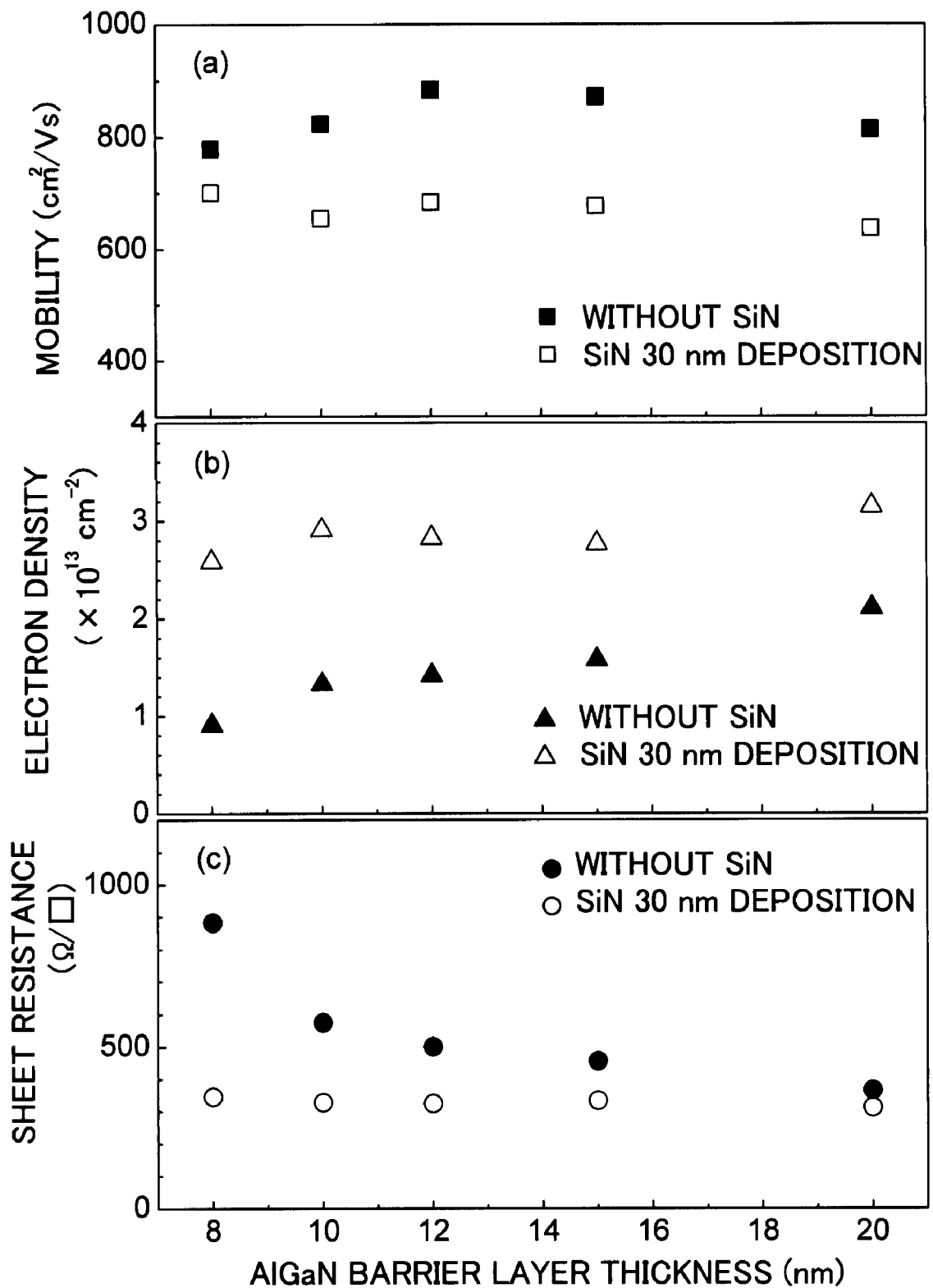
FIG. 2 is a graph showing relationships between a thickness of the AlGaN barrier layer and electron mobility, two-dimensional electron gas density and sheet resistance of the channel when 2-nm-thick SiN is deposited.

In FIG. 2, dependencies on the AlGaN barrier layer thickness for the electron mobility, the two-dimensional electron density, and the channel sheet resistance are plotted for $Al_{0.4}Ga_{0.6}N$/GaN heterostructure FETs having an $Al_{0.4}Ga_{0.6}N$ barrier layer of a thickness from 8 to 20 nm with and without a 30-nm-thick SiN insulating film deposited on the AlGaN surface. FIG. 2(a) is a graph showing the electron mobility. In FIG. 2(a), blackened marks indicate ones without SiN insulating film deposition, while outlined marks indicate ones with 30 nm of the SiN insulating film deposition. Compared to the ones without the SiN insulating film, it is seen that the ones with the SiN insulating film deposited on the AlGaN surface have mobilities slightly reduced. However, it is seen that for ones with the SiN insulating film deposited on the AlGaN surface, the mobility when the film thickness of the AlGaN barrier layer changes to 8 nm-20 nm is almost constant as 640 $cm^2$/Vs-700 $cm^2$/Vs, and the dispersion is small.

FIG. 2(b) is a graph showing the two-dimensional electron density. In FIG. 2(b), blackened marks indicate ones without SiN insulating film deposition, while outlined marks indicate ones with 30 nm of the SiN insulating film deposition. It is seen from FIG. 2(b) that compared to the ones without the SiN insulating film, ones with the SiN insulating film deposited on the AlGaN surface have two-dimensional electron densities largely increased. Moreover, it is seen that for ones with the SiN insulating film deposited on the AlGaN surface, the values of the two-dimensional electron densities when the film thickness of the AlGaN barrier layer changes to 8 nm-20 nm are almost constant between $2.6 \times 10^{13} cm^{-2}$-$3.2 \times 10^{13} cm^{-2}$, and the dispersion is small. Also, it is seen that the thinner the film thickness of the AlGaN barrier layer, the difference between the two-dimensional electron densities for ones with and without the SiN insulating film is more notable.

FIG. 2(c) is a graph showing the channel sheet resistance. In FIG. 2(c), blackened marks indicate ones without SiN insulating film deposition, while outlined marks indicate ones with 30 nm of the SiN insulating film deposition. The channel sheet resistance shown in FIG. 2(c) is in inverse proportion to the product of the mobility and the two-dimensional electron density. Thus, when there is an SiN insulating film, the channel resistance decreases compared to the case without the SiN insulating film. It is also seen that the effect thereof appears more notably when the AlGaN barrier layer is thin. Consequently, the ones without SiN insulating film deposition increase their sheet resistances as the AlGaN film thickness is reduced monotonically, while very little increase is seen in the ones with the SiN insulating film deposition.

Figure 3:
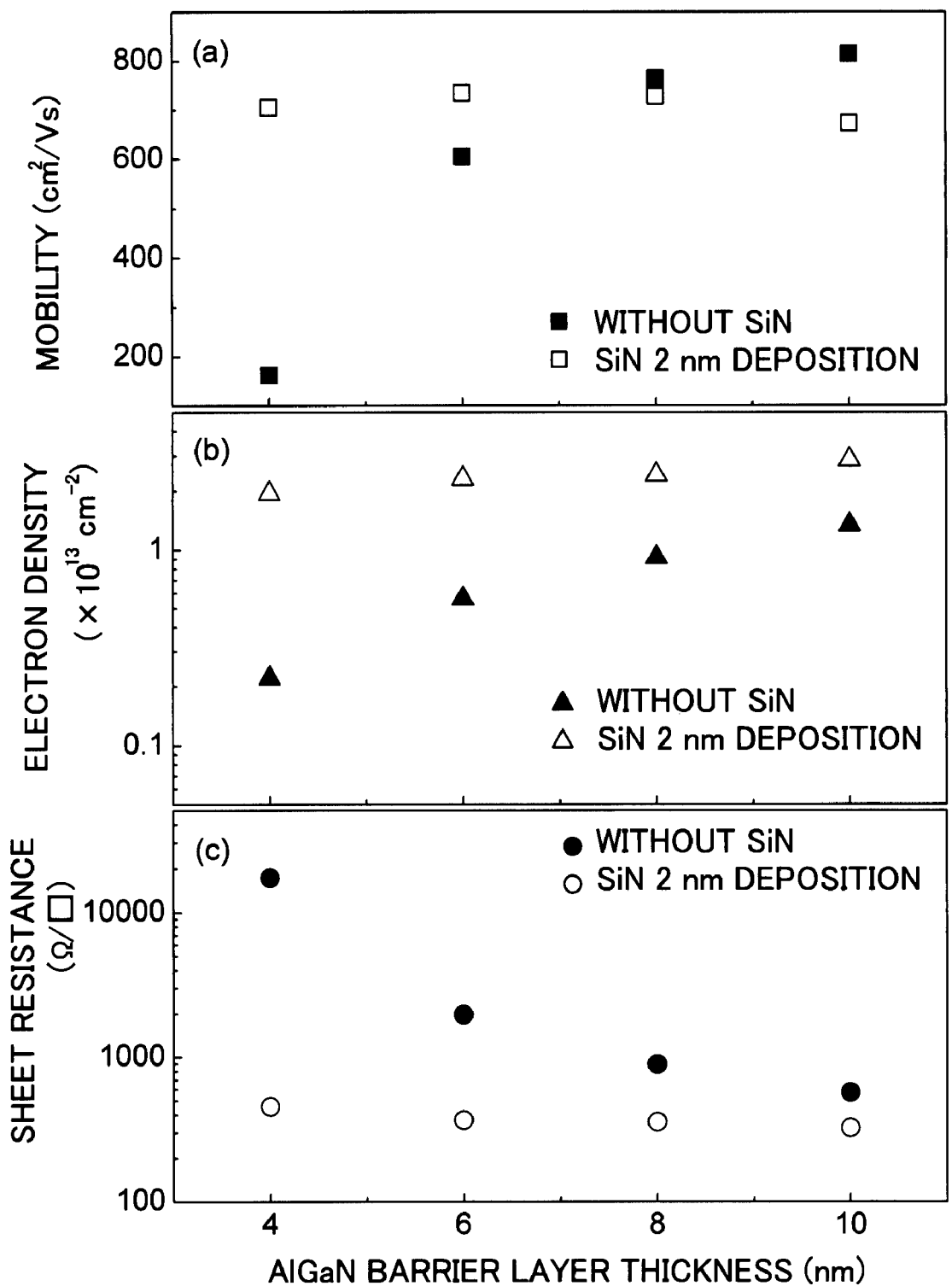
FIG. 3 is a graph showing relationships between a thickness of the AlGaN barrier layer and electron mobility, two-dimensional electron gas density and sheet resistance of the channel when 2-nm-thick SiN is deposited.

In FIG. 3, dependencies on the AlGaN barrier layer film thickness for electron mobility, two-dimensional electron density, and channel sheet resistance are plotted for $Al_{0.4}Ga_{0.6}N$/GaN heterostructure FETs having an $Al_{0.4}Ga_{0.6}N$ barrier layer of a thickness from 4 to 10 nm with and without 30 nm of SiN insulating film deposited on the AlGaN surface. FIG. 3(a) shows the electron mobility, FIG. 3(b) shows the two-dimensional electron density, and FIG. 3(c) shows the channel sheet resistance. In FIG. 3, blackened marks indicate ones without SiN insulating film deposition, while outlined marks indicate ones with 2 nm of the SiN insulating film deposition.

FIG. 3(a) is a graph showing the electron mobility. It is seen that for the ones with the SiN insulating film deposited on the AlGaN surface, the mobility when the film thickness of the AlGaN barrier layer changes from 4 nm-10 nm is almost constant as 670 $cm^2$/Vs-740 $cm^2$/Vs, and the dispersion is small.

FIG. 3(b) is a graph showing the two-dimensional electron density. It is seen from FIG. 3(b) that compared to the ones without the SiN insulating film, in the ones with the SiN insulating film deposited on the AlGaN surface, the two-dimensional electron densities are largely increased. Moreover, it is seen that for the ones with the SiN insulating film deposited on the AlGaN surface, the values of the two-dimensional electron densities when the thickness of the AlGaN barrier layer changes to 4 nm-10 nm are almost constant between $2.6 \times 10^{13}$ $cm^{-2}$-$3.2 \times 10^{13}$ $cm^{-2}$, and the dispersion is small. Also, it is seen that the thinner the thickness of the AlGaN barrier layer, the difference between the two-dimensional electron densities for ones with and without SiN insulating film is more notable.

FIG. 3(c) is a graph showing the channel sheet resistance. It is seen from FIG. 3(c) that compared to the ones without the SiN insulating film, the ones with the SiN insulating film deposited on the AlGaN surface have lower channel sheet resistances which show almost constant values even if the thickness of the AlGaN barrier layer changes.

As in the case of 30 nm of SiN insulating film shown in FIG. 2, it is seen from FIG. 3 that compared to the case without deposition, in the case where 2 nm of the SiN insulating film is deposited on the AlGaN surface, the two-dimensional electron density is largely increased, and the sheet resistance is largely decreased consequently. Also, the thinner the thickness of the AlGaN barrier layer, the difference between the two-dimensional electron densities for ones with and without the SiN insulating film is more notable.

These results are speculated to be attributable to the large decrease in the density of the surface states, due to neutralization of almost all of the high density surface states indicated by fixed charge existing on the AlGaN surface. It is speculated that when the thickness of the AlGaN barrier layer is thin, since the effect of the field where the surface states are generated (in this case, exerted in the direction to reduce the electron density of the channel) is large, a larger difference occurs between the cases with and without the SiN insulating film.

Reducing the thickness of the AlGaN barrier layer leads to improving the effectiveness of the gate and increasing the transconductance. However, usually in the case of an AlGaN/GaN heterostructure, the two-dimensional electron gas density of the channel is decreased by the reduction of the thickness, resulting in a disadvantage that the channel resistance is increased. However, by neutralizing the surface states using the insulating film deposition of the present invention, the AlGaN barrier layer can be made thin without reducing the two-dimensional electron density. This enables the resistance of the entire element in the AlGaN/GaN heterostructure FET to be held low, thereby leading to increases in drain current, output electric power, and transconductance.

Figure 4:
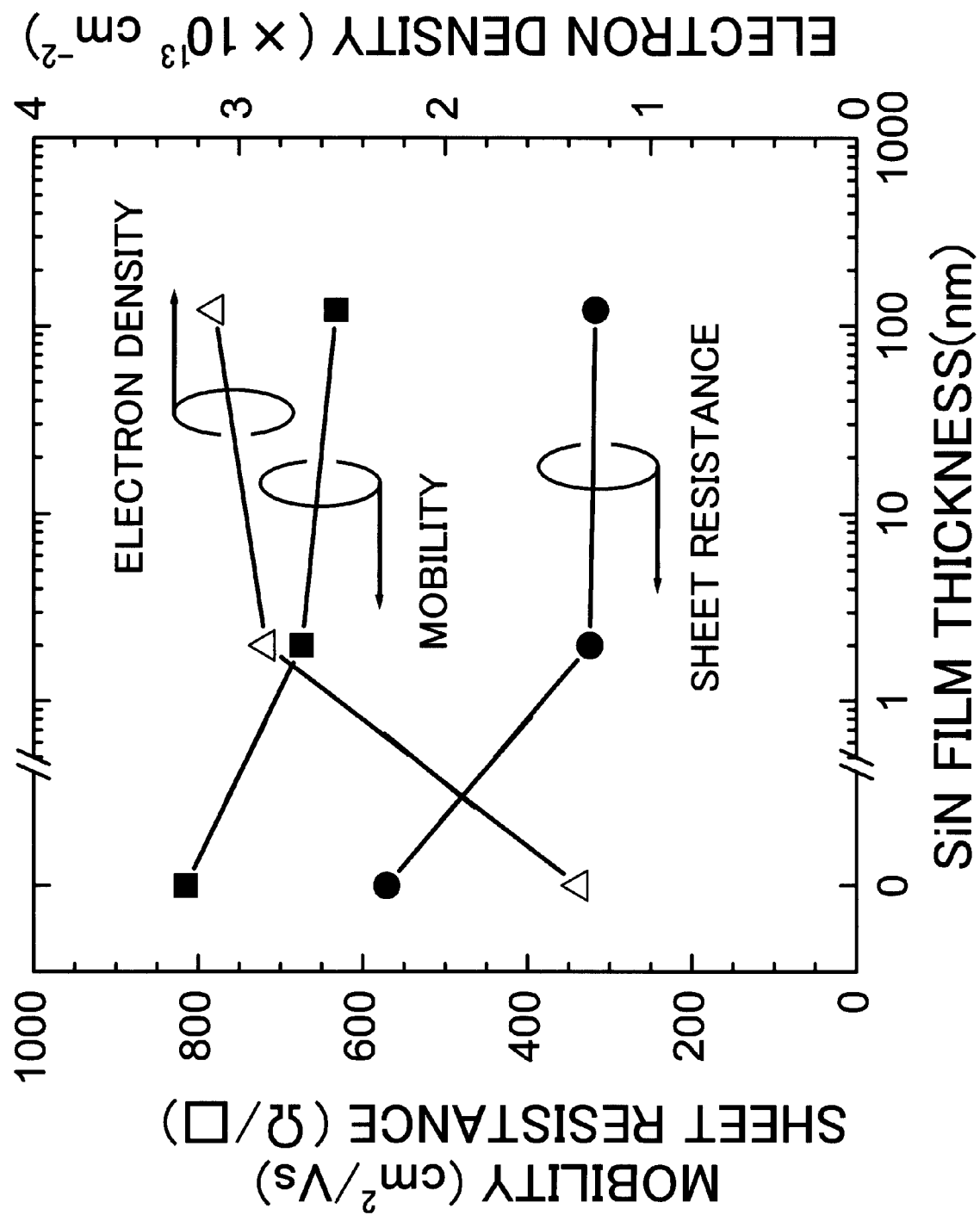
FIG. 4 is a graph showing relationships between a thickness of SiN and electron mobility, two-dimensional electron gas density, and sheet resistance of the channel at room temperature in a specimen whose AlGaN barrier layer has a film thickness of 8 nm.

In FIG. 4, the electron mobility, two-dimensional electron density, and channel sheet resistance are plotted for $Al_{0.4}Ga_{0.6}N/GaN$ heterostructure FETs having an $Al_{0.4}Ga_{0.6}N$ barrier layer whose film thickness is 8 nm without an SiN insulating film deposited on the AlGaN surface, with deposition of 2 nm, and with additional deposition of 120 nm (total deposition of 122 nm). As seen from FIG. 4, large increase in two-dimensional electron density and decrease in sheet resistance appear between the cases with and without the SiN deposition of 2 nm, however, large differences do not appear between the SiN deposition of 2 nm and the SiN deposition of 122 nm. Accordingly, it is seen that the large increase in two-dimensional electron density by the SiN deposition is an effect exerted only by covering the surface with the SiN regardless of the SiN film thickness.

Figure 5:
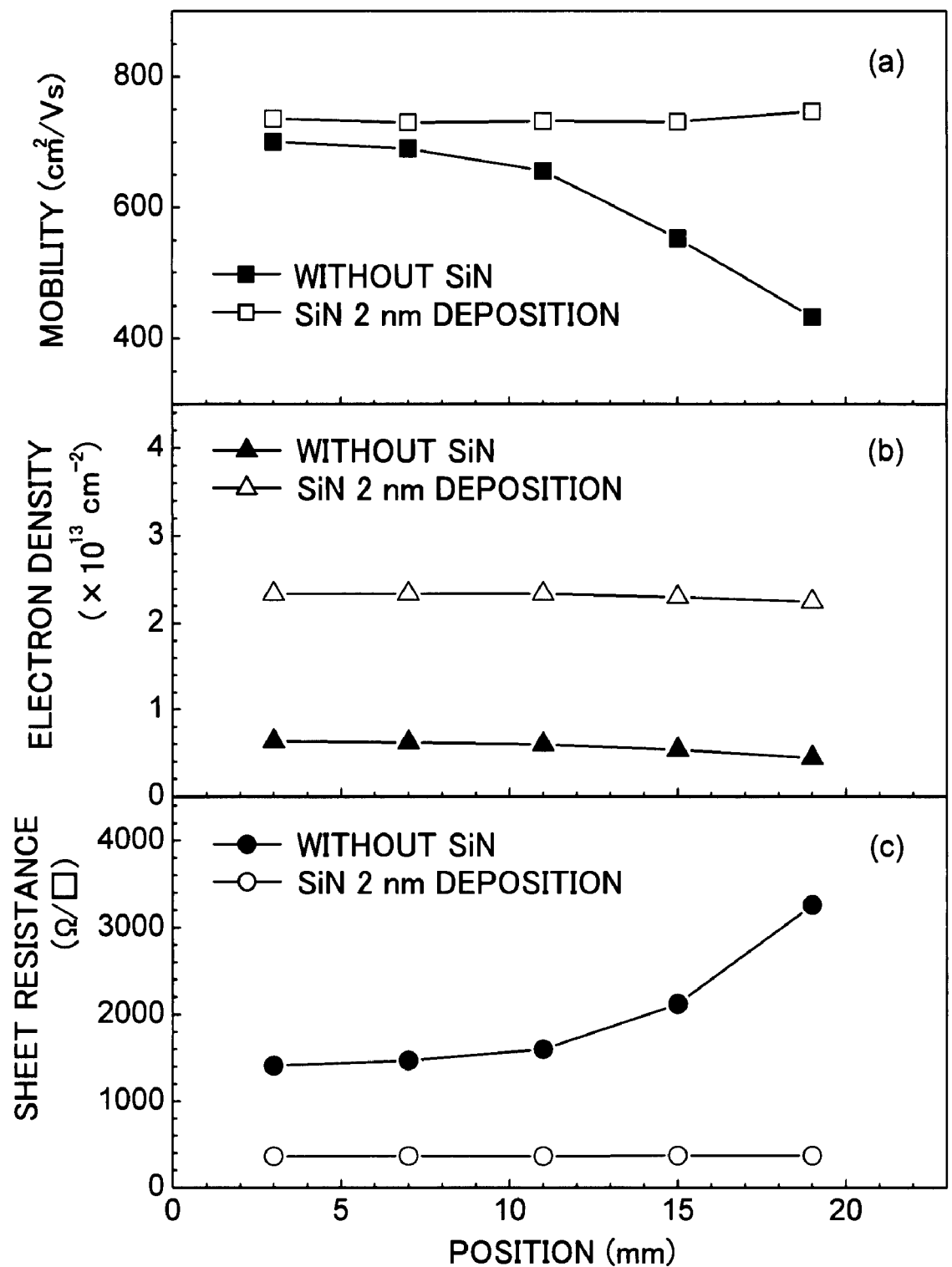
FIG. 5 is a graph showing relationships between a thickness of SiN and room-temperature electron mobility, two-dimensional electron gas density, and sheet resistance of the channel at different positions of wafers where SiN is not deposited and where 2-nm-thick SiN is deposited in a specimen whose AlGaN barrier layer has a thickness of 6 nm.

In FIG. 5, position dependencies on a wafer for the electron mobility, the two-dimensional electron density, and the channel sheet resistance are plotted for $Al_{0.4}Ga_{0.6}N/GaN$ heterostructure FETs having an $Al_{0.4}Ga_{0.6}N$ barrier layer whose film thickness is 6 nm without SiN insulating film deposited on the AlGaN surface and with deposition of 2 nm. FIG. 5(a) shows the electron mobility, FIG. 5(b) shows the two-dimensional electron density, and FIG. 5(c) shows the channel sheet resistance. Positions of the horizontal axis indicate distances from the center of a 2-inch wafer to measured points. Namely, as the numeric value increases, the measured position is moved from the center to the edge of the substrate. In FIG. 5, blackened marks indicate ones without SiN insulating film deposition, while outlined marks indicate ones with 2 nm of the SiN insulating film deposition. As seen from FIG. 5(a)-FIG. 5(c), dispersions of mobility depending on the position on the wafer appear for the ones without the SiN insulating film deposition on the AlGaN surface. This indicates that since the AlGaN barrier layer surface is extremely close to the channel, the difference of the AlGaN surface state density due to minimal differences in growth conditions greatly affects the mobility of electron in the channel. However, by deposition of the SiN insulating film for 2 nm, as described above, almost all of the high density surface states indicated by fixed charges existing on the AlGaN surface is neutralized, the density of the surface states is largely decreased, so that a difference in electron density by the positions on the wafer is eliminated, and the uniform electron mobility in the wafer plane can be obtained. Consequently, the uniformity of sheet resistance in the plane is also largely improved.

Namely, as described above, even if the film thickness is minimal, the SiN insulating film yields effects on the mobility and the electron density, as shown in FIG. 5(a), for the ones with the SiN insulating film deposited on the AlGaN surface, the electron mobility on the wafer is almost constant as 730 $cm^2/Vs$-750 $cm^2/Vs$, and the change in election mobility within the range of 20 mm from a specific position (percentage of the difference between the maximum value and the minimum value electron mobility when the maximum value is assumed to be 100%) is 10% or less (preferably 5% or less).

FIG. 5(b) is a graph showing the two-dimensional electron density. It is seen from FIG. 5(b) that compared to the case without deposition, in the case where 2 nm of the SiN insulating film is deposited on the AlGaN surface, the two-dimensional electron density is largely increased. Also, for the one with the SiN insulating film deposited on the AlGaN surface, the two-dimensional electron density on the wafer is almost uniform between $2.25 \times 10^{13} cm^{-2}$-$2.35 \times 10^{13} cm^{-2}$, and the change of the two-dimensional electron density within the rage of 20 mm from a specific position (percentage of the difference between the maximum value and the minimum value of the two-dimensional electron density when the maximum value is assumed to be 100%) is 10% or less (preferably 5% or less).

FIG. 5(c) is a graph showing the channel sheet resistance. It is seen from FIG. 5(c) that compared to the one without deposition, in the one with the SiN insulating film deposited on the AlGaN surface, the channel sheet resistance is low, and assumes an almost constant value (specifically, 360Ω/□-370Ω/□) even if the film thickness of the AlGaN barrier layer changes. More specifically, the change of the sheet resistance within the range of 20 mm from a specific position (percentage of the difference between the sheet resistance when the maximum value is assumed to be 100%) is 10% or less (5% or less).

(3. Production Method)

The heterostructure FET of the present invention can be produced by growing crystal with publicly known methods such as RF plasma molecular beam epitaxy (RF-MBE), gas source molecular beam epitaxy using ammonia gas, and metalorganic vapor phase epitaxy. For example, in the crystal growth method for AlGaN/GaN heterostructure FET structure by RF-MBE, in case of GaN, the substrate placed in an ultrahigh vacuum growth chamber is heated, the gallium molecular beam evaporated from gallium source heated in the Knudsen cell and the nitrogen radicals obtained by decomposing nitrogen gas ($N_2$) with RF plasma are simultaneously provided to the substrate, whereby the GaN crystal can be grown. In case of growing AlGaN, its production is possible by further providing aluminum molecular beam to the substrate (for example, see Japanese patent application laid-open No. 2003-192497). Also, the heterostructure FET may be produced by a method described in Japanese patent application laid-open No. 2003-258005, and Japanese patent application laid-open No. 2003-243424. Hereinafter, method for producing the heterostructure FET structure of the present invention will be described referring to the drawings.

Figure 6:
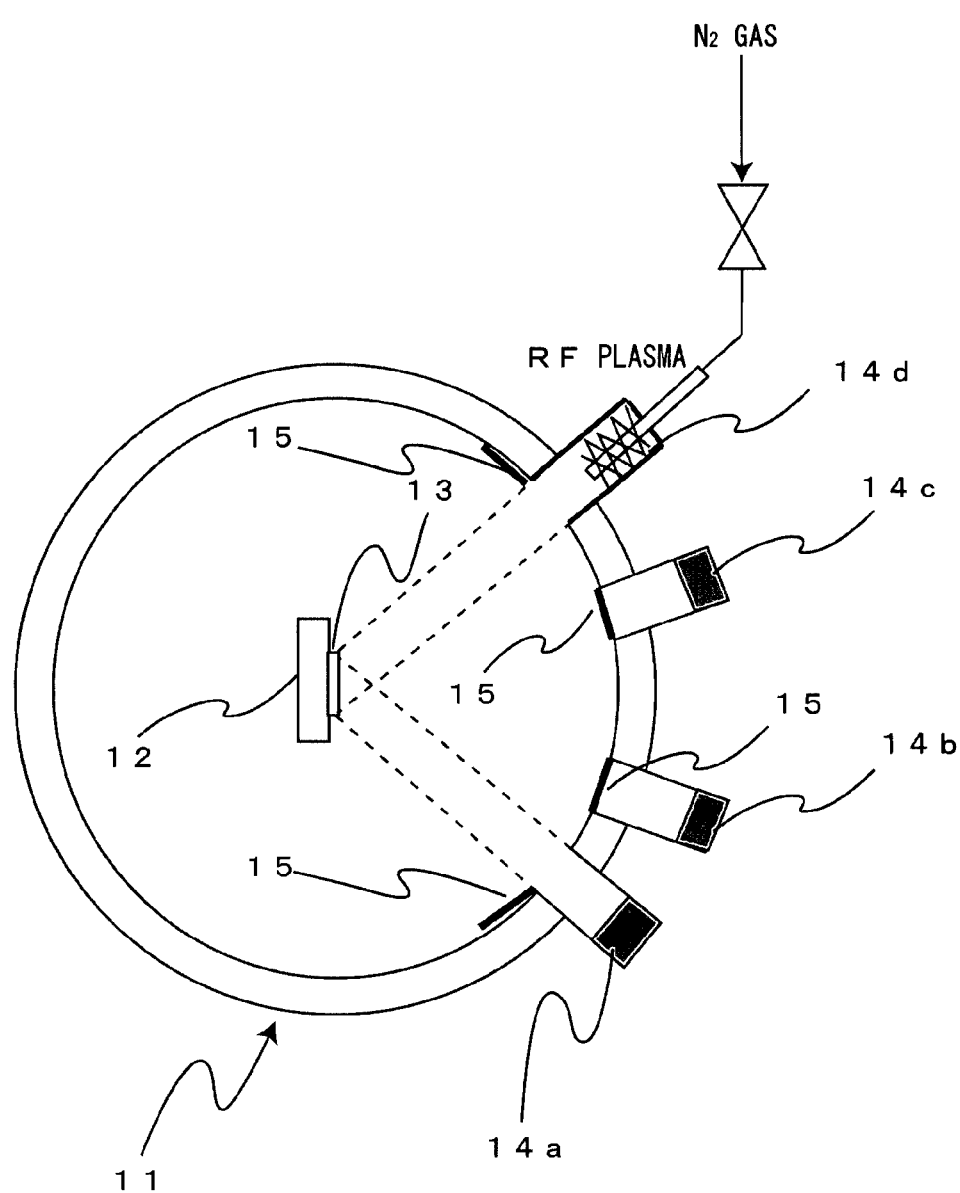
FIG. 6 is a diagram showing a schematic configuration of an RF-MBE apparatus used for an RF-MBE method.

FIG. 6 is a diagram showing a schematic configuration of an RF-MBE apparatus used for the RF-MBE method. In the RF-MBE apparatus, a heater 12 is provided in a growth chamber 11 for which ultrahigh vacuum can be realized by a vacuum pump (figures omitted), and a sapphire substrate 13 is heated up by this heater. Also, an Al cell 14a, a Ga cell 14b, an In cell 14c, and an RF plasma cell 14d for irradiating molecular beams and radicals on the sapphire substrate 13 are provided, each of which can be opened and closed by a shutter 15. It is to be noted that FIG. 6 shows an example at the time where shutters for the Al cell 14a and the RF plasma cell 14d are opened.

Hereinafter, an example where the epitaxial structure shown in FIG. 1 is produced by using the RF-MBE apparatus shown in FIG. 6 will be described. It is to be noted that firstly, the sapphire substrate 13 is cleaned by using an organic solvent. In order to improve a heat-up capability, high melting point metal is vacuum metallized on the back side of the sapphire substrate 13. The sapphire substrate 13 is placed with its back side facing the heater 12 in the growth chamber 11, heated up to approximately 800 degrees C. or more, the substrate surface of the sapphire substrate 13 is cleaned at a high temperature.

Thereafter, the substrate temperature is lowered to approximately 300 degrees C., a high-purity nitrogen gas is decomposed by the RF plasma cell 14d. The nitrogen radicals thus obtained are provided onto the sapphire substrate 13 for nitridation of the sapphire substrate surface, thereby forming a thin aluminum nitride film on the surface. As the plasma power, 100W-700W can be mentioned, and 200W-600W is preferable. As the flow rate of the nitrogen gas, 0.1 sccm-2.0 sccm can be mentioned, where 0.3 sccm-1.5 sccm is preferable, and 0.5 sccm-1.2 sccm is more preferable.

Successively, the temperature of the sapphire substrate 13 is increased by the heater 12 to 900 degrees C., for example. Then, by heating in the Knudsen cell, the aluminum molecular beam is obtained. The aluminum molecular beam and the nitrogen radicals generated by the RF plasma are simultaneously provided onto the sapphire substrate 13, thereby growing the AlN buffer layer.

Herein, as the growth temperature of the AlN buffer layer, 700 degrees C. or more can be mentioned, while a preferable temperature range is 800 degrees C.-900 degrees C. In case the temperature is 700 degrees C. or above, growth of Al polar AlN is realized where AlN and GaN layers with better quality can be grown on the Al-polar AlN than on the N polar one. Also, in case the temperature is 600 degrees C. or below, the polarity of the AlN buffer layer tends to be N polarity.

Thereafter, the shutter 15 of the Al cell 14a is closed and the shutter 15 of the Ga cell 14b is opened. With this process, the gallium molecular beam and the nitrogen radicals are simultaneously provided onto the sapphire substrate 13, thereby growing the GaN layer on the AlN buffer layer.

Herein, as the growth temperature of the GaN layer, 650 degrees C. or above can be mentioned, and the preferable temperature range is 700 degrees C.-800 degrees C. When the temperature is 800 degrees C. or above, the amount of Ga atoms that are not taken into the GaN crystal during the growth becomes extremely large, the growth rate becomes extremely reduced. On the other hand, when the temperature is 700 degrees C. or below, the crystal quality of the GaN layer will be poor.

After the growth of the GaN layer up to the predetermined thickness as described above, the shutter 15 for the Al cell 14a is opened with keeping the shutters 15 for the Ga cell 14b and the nitrogen open. This leads to the growth of the AlGaN layer.

It is to be noted that an AlN spacer layer may be formed before forming the AlGaN layer.

Herein, the growth temperature of the AlGaN layer has the same condition as that of the GaN, wherein the preferable temperature range is 700 degrees C.-800 degrees C. When the temperature is 800 degrees C. or above, the amount of Ga molecular beam that is not taken into the AlGaN crystal during the growth becomes extremely large, the growth rate becomes extremely reduced so that it becomes difficult for determining the composition of the AlGaN. Also, when the temperature is 700 degrees C. or below, the crystal quality of the AlGaN layer will be poor.

As the growth rate of the AlGaN layer, 1 nm/hr-5000 nm/hr can be mentioned, while 10 nm/hr-2000 nm/hr is preferable, and 50 nm/hr-1000 nm/hr is more preferable, 100 nm/hr-800 nm/hr is further more preferable, and 300 nm/hr-700 nm/hr is especially preferable. This is because if the growth rate is too slow or too fast, crystal with an excellent crystal quality is hard to be obtained.

Next, electrodes (source, gate, and drain electrodes) are formed by publicly known methods.

After forming the electrodes, the insulating film is deposited. The insulating film may be formed by a CVD (chemical vapor deposition) method using materials formed of any one of or more than two of SiN, $SiO_2$, SiON, $Al_2O_3$, or AlN. As the CVD method used for forming an insulating film, a thermal CVD, an ECR-CVD, a VHF-CVD, and a hot wire CVD can be mentioned, wherein the hot wire CVD method is preferable. The hot wire CVD is a method utilizing a catalytic effect of a tungsten surface, which is also called a catalytic CVD or a hot filament CVD.

For the hot wire CVD, apparatus and method described in e.g. Japanese patent application laid open No. 2004-27326, Japanese patent No. 1704110, Japanese patent No. 3145536, Japanese patent application laid-open No. 2000-277501, Japanese patent application laid open Nos. 2000-277502, 2004-35981, 2004-91802, 2004-91821, 2004-99917, and 2004-103745 may be used as appropriate.

For example, as raw gas when forming the SiN insulating film, any one of or a plurality of compounds of hydrogen, nitrogen, or halogen element such as $SiH_4$, $Si_2H_6$, $Si_3H_8$, $SiF_4$, $SiCl_4$, $SiCl_2H_2$ can be mentioned as silicon raw gas, and either one or both of $NH_3$ and $N_2O$ can be mentioned as nitrogen raw gas (see Japanese patent application laid-open Nos. 5-095120, 2000-208417), while preferable silicon raw gas is $SiH_4$, and preferable nitrogen raw gas is $NH_3$.

$H_2$, $N_2$, He, Ar, Ne, Xe, or the like may be used as gas for dilution.

Upon film formation, these gasses are adjusted to a desired flow rate and mixing ratio by using a pressure reducing valve, a mass flow controller, and the like, guided into a reaction chamber, and provided to the heating element through numerous gas vents formed on an external wall of a cassette main body. As the heating element, high melting point metal such as tungsten is generally used.

The gas pressure upon film formation may be set to 0.1-100 Pa, while 1.0-10 Pa is preferable, and 3-7 Pa is more preferable. By setting the gas pressure within this range, the provided gas can be effectively decomposed and transported. Also, secondary reaction in the gas phase among reaction products is suppressed, so that a high-quality insulating film can be formed on the substrate as a result.

As the substrate temperature upon insulating film deposition, 150 degrees C.-800 degrees C. can be mentioned, while 200-500 degrees C. is preferable, and 200-400 degrees C. is more preferable, but 250-500 degrees C., 300-500 degrees C., 300-450 degrees C., or 350-400 degrees C. is acceptable. As the deposition rate of the insulating film, 0.1 nm/hr-5000 nm/hr can be mentioned, while 1 nm/hr-100 nm/hr is preferable, 1 nm/hr-50 nm/hr is more preferable, 1 nm/hr-30 nm/hr is further preferable, and 1 nm/hr-20 nm/hr is especially preferable.

It is to be noted that as a measurement method of the substrate temperature upon deposition in the present invention, measurement of temperature by a thermocouple may be adopted. Also, for hot wire CVD, the temperature may be measured by a thermocouple attached to a substrate holder.

Also, the thickness of each layer can be controlled by the deposition time. The thickness may be measured from a cross-sectional micrograph observed by TEM (transmission electron microscope). As a TEM apparatus, a transmission electron microscope (Model H-7100FA, manufactured by Hitachi, Ltd.) can be mentioned as an example. Also, in order to measure the thickness and the refractive index of the insulating film, publicly known apparatuses such as an ellipsometer can be used.

EXAMPLE 1

Hereinafter, an example of an AlGaN/GaN heterostructure FET on a sapphire substrate produced by the above-mentioned growth method for GaN-based compound semiconductors will be described.

A sapphire substrate was cleaned with organic solvent. The sapphire substrate, which had high melting point metal titanium evaporated on the back face in order to improve the heat-up capability of the substrate, was set at a substrate heater in the MBE growth chamber maintained at ultrahigh vacuum (e.g., $10^{-11}$ Torr-$10^{-10}$ Torr). Then, the substrate was heated up to about 800 degrees C. and held at the temperature for 30 minutes for a high temperature cleaning of the substrate surface. Thereafter, the substrate temperature was lowered to 300 degrees C. Subsequently, nitrogen radicals obtained by decomposing nitrogen gas with the RF plasma were irradiated thereto. The sapphire substrate surface was nitrided for 60 minutes, and a thin aluminum nitride layer was formed on the surface.

The shutter 15 of the RF plasma cell 14d was left open, and without discontinuing the irradiation of nitrogen radicals to the substrate surface, the substrate temperature was heated up to 900 degrees C. Thereafter, the shutter of the Al cell 14a was opened, the AlN buffer layer was grown until the thickness assumed 300 nm. The substrate temperature was lowered to 730 degrees C. Thereafter, the shutter of the Al cell 14a was closed and the shutter of the Ga cell 14b was opened simultaneously, and the GaN layer was grown until the film thickness assumed 1500 nm at the substrate temperature of 730 degrees C.

After the growth of the GaN layer is completed, the shutter of the Ga cell 14b was closed and the shutter of the Al cell 14a was opened simultaneously, and the AlN layer was grown until the film thickness assumed 1.3 nm. Thereafter, the shutter of the Ga cell 14b was opened, and the AlGaN layer was grown until the film thickness assumed 8 nm.

After obtaining the semiconductor epitaxial structures, electrodes were formed. Insulation among adjoining transistors was obtained by reactive gas etching to the GaN layer. Subsequently, a metal multilayer formed with Ti/Al/Ni/Au was vacuum metallized on the AlGaN barrier layer, heated with an infrared lamp to obtain an ohmic contact between the semiconductor layer and the metal, so that source and drain electrodes were prepared. The source-drain electrode spacing was 5 μm. Finally, by vacuum metalizing Ni/Au on the AlGaN barrier layer to obtain a Schottky contact, a gate electrode of 1 μm long and 50 μm wide (deep) was prepared.

After completing the electrode process, an SiN insulating film whose thickness was 30 nm was deposited on the transistor surface by the hot wire CVD. Thereafter, in order to allow probing upon measurement of device characteristics, SiN opening was performed at the electrode metal pad portion by providing a reactive gas etching whereby the SiN is etched.

The transistor thus produced had a maximum drain current density of 590 mA/mm and a maximum transconductance of 291 mS/mm.

COMPARATIVE EXAMPLE 1

A heterostructure FET was produced with a similar process to the example 1 except that the SiN deposition was not performed. This heterostructure FET had a maximum drain current density of 425 mA/mm and a maximum transconductance of 229 mS/mm.

EXAMPLE 2

A heterostructure FET was produced with a similar process to the example 1 except that the AlGaN thickness was 18 nm. This heterostructure FET had a maximum drain current density of 725 mA/mm and a maximum transconductance of 190 mS/mm.

COMPARATIVE EXAMPLE 2

A heterostructure FET was produced with a similar process to the example 2 except that the SiN deposition was not performed. This heterostructure FET had a maximum drain current density of 660 mA/mm and a maximum transconductance of 160 mS/mm.

From the example 1 and comparison example 1 as well as the example 2 and comparison example 2, it is seen that the thinner the thickness of the barrier layer, the current density and the transconductance are improved due to the effect of the insulating film.

EXAMPLE 3

Figure 7:
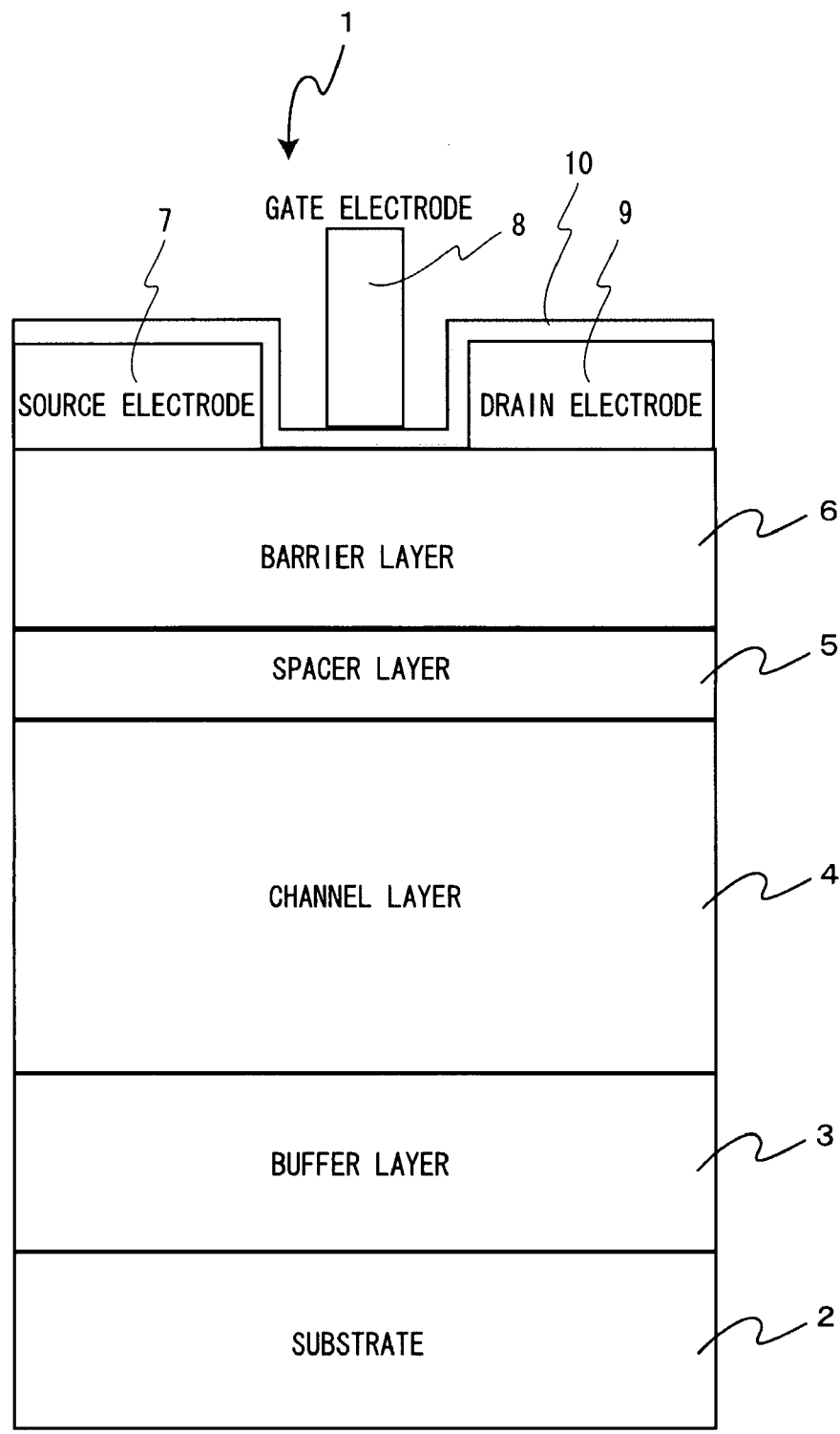
FIG. 7 is a schematic diagram showing a heterostructure FET according to the second embodiment of the present invention.
Figure 8:
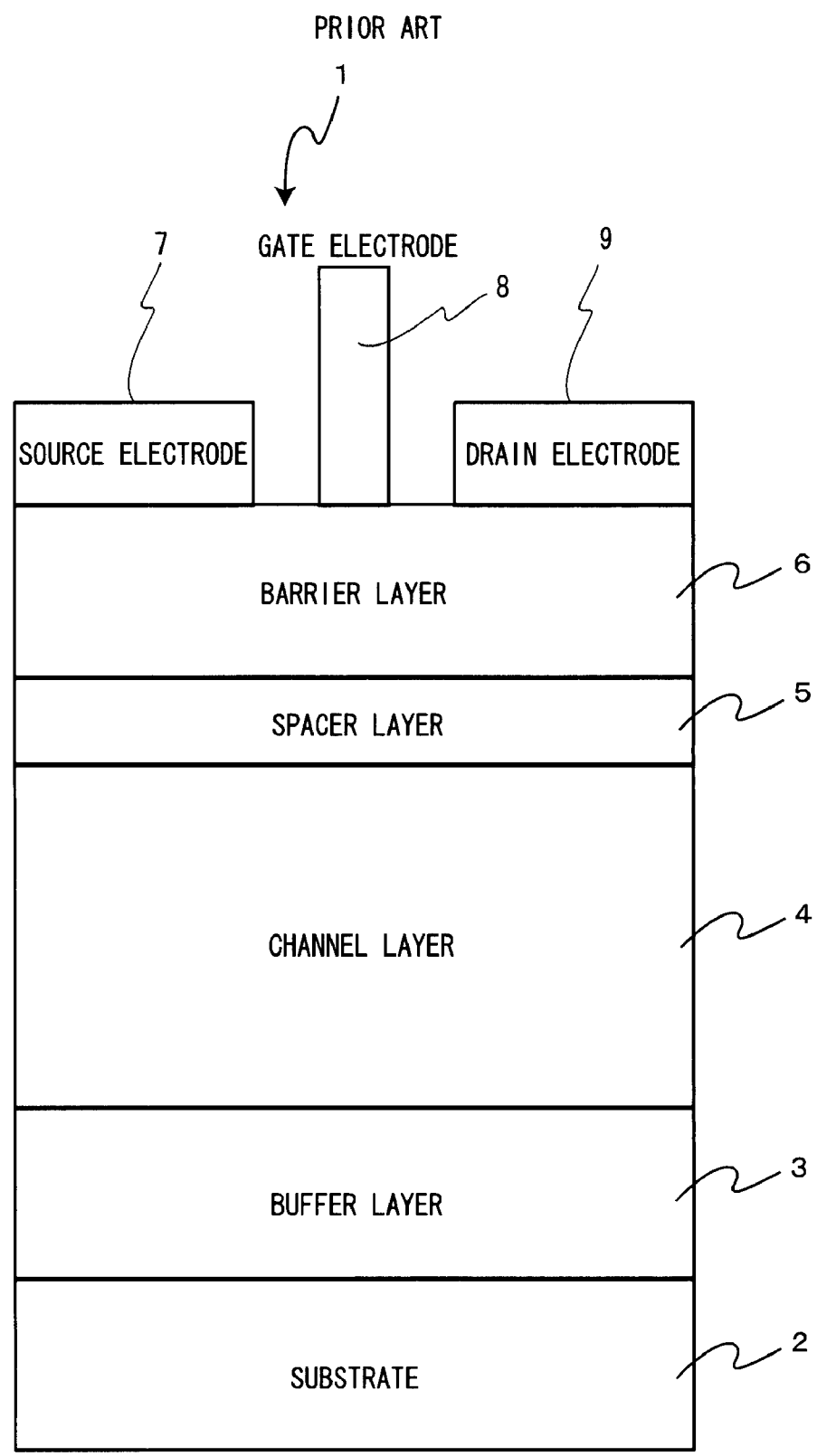
FIG. 8 is a schematic diagram showing an FET without an insulating film, for describing features of the present invention.

A heterostructure FET was produced by using the AlGaN film whose thickness is 10 nm, and with the same process as that of the example 1 until the preparation of the source and drain electrodes, whereafter the SiN insulating film was deposited for 2 nm, and a gate electrode with a further reduced length was prepared on the SiN insulating film by using electron beam lithography. Compared to the example 1, the gate electrode metal was changed from Ni/Au to Ti/Pt/Au, the source drain electrode spacing was changed from 5 μm to 2 μm, the gate length was changed from 1 μm to 0.06 μm, the gate width was changed from 50 μm to 100 μm. It is to be noted that while the gate electrode was prepared on the AlGaN barrier layer in the example 1, the gate electrode metal was prepared on the SiN insulating film in the example 3, so that a heterostructure FET with an MIS-gate structure as shown in FIG. 7 was obtained. This heterostructure FET had a maximum drain current density of 1.55 A/mm, a maximum transconductance of 340 mS/mm, a current gain cutoff frequency of 152 GHz, and a maximum oscillation frequency of 173 GHz.

EXAMPLE 4

A heterostructure FET was produced with a similar process to the example 3 except that an AlGaN thickness was 8 nm. This heterostructure FET had a maximum drain current density of 1.25 A/mm, a maximum transconductance of 305 mS/mm, a current gain cutoff frequency of 163 GHz, and a maximum oscillation frequency of 184 GHz.

EXAMPLE 5

A heterostructure FET was produced with a similar process to the example 3 except that an AlGaN thickness was 6 nm. This heterostructure FET had a maximum drain current density of 1.2 A/mm, a maximum transconductance of 336 mS/mm, a current gain cutoff frequency of 153 GHz, and a maximum oscillation frequency of 182 GHz.

EXAMPLE 6

A heterostructure FET was produced with a similar process to the example 3 except that an AlGaN thickness was 4 nm. This heterostructure FET had a maximum drain current density of 1.05 A/mm, a maximum transconductance of 391 mS/mm, a current gain cutoff frequency of 127 GHz, and a maximum oscillation frequency of 188 GHz.

INDUSTRIAL APPLICABILITY

The heterostructure FET of the present invention can be utilized as an FET capable of supporting high speed and high frequency.

The heterostructure FET of the present invention can be utilized as a device used in an in-vehicle crash-avoidance radar, an intelligent transport system (ITS), an on-vehicle wireless device for such as inter-vehicle communication, or the like.

The heterostructure FET of the present invention can be effectively utilized in outer space or the like since it stably operates at high temperature, and it is hard to be degraded by the nuclear radiation. Therefore, the heterostructure FET of the present invention can be utilized as an electronic device used in outer space such as in a satellite and a planetary exploration spacecraft.

The invention claimed is:

1. A GaN-based field-effect transistor comprising:
   a substrate;
   a buffer layer;
   a channel layer consisting of GaN;
   a barrier layer consisting of AlGaN; and
   an insulating film on a surface of the GaN-based field-effect transistor device,
   wherein the GaN-based field-effect transistor has a heterostructure including the channel layer and the barrier layer,
   wherein the insulating film comprises SiN formed by a hot wire CVD method,
   wherein a thickness of the insulation film is 1 nm-100 nm,
   wherein a thickness of the barrier layer is 1-30 nm, and
   wherein the thickness of the barrier layer is constant.

2. The field-effect transistor as claimed in claim 1, wherein a change in an electron mobility in a range within 20 mm from a specific position of the field-effect transistor is equal to or less than 10%.

3. The field-effect transistor as claimed in claim 1, wherein a change in a two-dimensional electron density in a range within 20 mm from a specific position of the field-effect transistor is equal to or less than 10%.

4. The field-effect transistor as claimed in claim 1, wherein a thickness of the barrier layer is 3-20 nm.

5. The field-effect transistor as claimed in claim 1, wherein a thickness of the barrier layer is 5-15 nm.

6. The field-effect transistor as claimed in claim 1, wherein a thickness of the channel layer is 100 nm-10 μm.

* * * * *